(12) United States Patent
Watanabe

(10) Patent No.: US 9,479,158 B2
(45) Date of Patent: Oct. 25, 2016

(54) SWITCHING DEVICE, AND SOLAR POWER GENERATION SYSTEM AND VEHICLE DRIVING SYSTEM USING THE SAME

(71) Applicant: SANYO ELECTRIC CO., LTD., Osaka (JP)

(72) Inventor: Keisuke Watanabe, Mizuho (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 694 days.

(21) Appl. No.: 13/770,922

(22) Filed: Feb. 19, 2013

(65) Prior Publication Data

US 2013/0162023 A1 Jun. 27, 2013

Related U.S. Application Data

(63) Continuation of application No. PCT/JP2012/004359, filed on Jul. 5, 2012.

(30) Foreign Application Priority Data

Jul. 29, 2011 (JP) ................. 2011-166983

(51) Int. Cl.
*H03K 17/687* (2006.01)
*B60L 11/18* (2006.01)
(Continued)

(52) U.S. Cl.
CPC ............ *H03K 17/687* (2013.01); *B60L 8/003* (2013.01); *B60L 11/18* (2013.01); *H02J 1/00* (2013.01);
(Continued)

(58) Field of Classification Search
CPC .......... H03K 17/687; H03K 17/6874; H03K 17/122; H03K 2217/0036; H03K 2217/0054; B60L 8/003; B60L 11/18; H02J 1/00; H02J 3/383; Y10T 307/707; Y02E 60/721; Y02E 10/563; Y02T 10/7083; Y04S 10/126
USPC ............................................. 307/9
See application file for complete search history.

(56) References Cited

U.S. PATENT DOCUMENTS 4,589,051 A * 5/1986 Santurtun ............ H02H 7/1225
                                                    361/100
8,493,020 B2 * 7/2013 Lee ..................... H01M 10/465
                                                    307/66

(Continued)

FOREIGN PATENT DOCUMENTS

CN   201804798 U    4/2011
JP   7-213062 A     8/1995

(Continued)

OTHER PUBLICATIONS

International Search Report issued in International Application No. PCT/JP2012/004359 dated Oct. 9, 2012.

(Continued)

*Primary Examiner* — Jared Fureman
*Assistant Examiner* — Emmanuel R Dominique
(74) *Attorney, Agent, or Firm* — McDermott Will & Emery LLP

(57) ABSTRACT

A series-parallel switch circuit is constituted by connecting, in parallel, multiple series switch circuits in which a first switch receiving electric current and a second switch outputting the electric current are connected in series. Middle points of the multiple series switch circuits are joined. When the series-parallel switch circuit is turned on, the second switches constituting the series-parallel switch circuit are turned on, and thereafter, the first switches constituting the series-parallel switch circuit are turned on.

13 Claims, 10 Drawing Sheets

(51) Int. Cl.
*H02J 1/00* (2006.01)
*B60L 8/00* (2006.01)
*H03K 17/12* (2006.01)
*H02J 3/38* (2006.01)

(52) U.S. Cl.
CPC ........ *H03K 17/122* (2013.01); *H03K 17/6874* (2013.01); *H02J 3/383* (2013.01); *H03K 2217/0036* (2013.01); *H03K 2217/0054* (2013.01); *Y02E 10/563* (2013.01); *Y02E 60/721* (2013.01); *Y02T 10/7083* (2013.01); *Y04S 10/126* (2013.01); *Y10T 307/707* (2015.04)

(56) References Cited

U.S. PATENT DOCUMENTS

| | | | |
|---|---|---|---|
| 8,639,413 B2 | 1/2014 | Endo | |
| 2004/0036459 A1* | 2/2004 | Wiktor | H02M 3/1588 323/282 |
| 2004/0052125 A1* | 3/2004 | Tankard | H02P 25/092 365/200 |
| 2007/0205431 A1* | 9/2007 | Robb | H01L 21/823487 257/119 |
| 2008/0238214 A1 | 10/2008 | Barbosa et al. | |
| 2008/0278116 A1* | 11/2008 | Matsunaga | H01M 10/44 320/134 |
| 2009/0152947 A1* | 6/2009 | Wang | H02J 1/14 307/24 |
| 2009/0173554 A1* | 7/2009 | Yoshioka | E02F 3/325 180/65.8 |
| 2009/0243538 A1* | 10/2009 | Kelty | B60L 11/1851 320/104 |
| 2009/0284447 A1* | 11/2009 | Koizumi | G09G 3/296 345/60 |
| 2010/0090524 A1* | 4/2010 | Obayashi | B60L 11/1816 307/9.1 |
| 2011/0020719 A1* | 1/2011 | Manabe | H01M 8/04589 429/429 |
| 2011/0320082 A1* | 12/2011 | Ishishita | B60K 6/445 701/22 |
| 2012/0022744 A1* | 1/2012 | Endo | B60H 1/00392 701/36 |
| 2012/0243130 A1* | 9/2012 | Gaben | H01M 10/425 361/42 |

FOREIGN PATENT DOCUMENTS

| | | |
|---|---|---|
| JP | 2003-079058 A | 3/2003 |
| JP | 2005-164381 A | 6/2005 |
| JP | 2005-261076 A | 9/2005 |
| JP | 2008-259202 A | 10/2008 |
| JP | 2008-283743 A | 11/2008 |
| JP | 2008-283827 A | 11/2008 |
| JP | WO/2011/030401 * | 3/2011 |

OTHER PUBLICATIONS

English translation Search Report Chinese Application No. 201280022048.1 dated Sep. 7, 2015.

* cited by examiner

100

FIG.3A
| M2a | M1a |
|---|---|
| OFF | OFF |
| M2b | M1b |
| OFF | OFF |
FIG.3B
| M2a | M1a |
|---|---|
| ON | OFF |
| M2b | M1b |
| ON | OFF |
FIG.3C
| M2a | M1a |
|---|---|
| ON | ON |
| M2b | M1b |
| ON | OFF |
FIG.3D
| M2a | M1a |
|---|---|
| ON | ON |
| M2b | M1b |
| ON | ON |

FIG.4A
| M2a | M1a |
|-----|-----|
| ON  | ON  |
| M2b | M1b |
| ON  | ON  |
FIG.4B
| M2a | M1a |
|-----|-----|
| ON  | ON  |
| M2b | M1b |
| ON  | OFF |
FIG.4C
| M2a | M1a |
|-----|-----|
| ON  | OFF |
| M2b | M1b |
| ON  | OFF |
FIG.4D
| M2a | M1a |
|-----|-----|
| OFF | OFF |
| M2b | M1b |
| OFF | OFF |

SWITCHING DEVICE, AND SOLAR POWER GENERATION SYSTEM AND VEHICLE DRIVING SYSTEM USING THE SAME

RELATED APPLICATIONS

This application is a Continuation of International Application No. PCT/JP2012/004359, filed on Jul. 5, 2012, which in turn claims the benefit of Japanese Application No. 2011-166983, filed on Jul. 29, 2011, the disclosures of which Applications are incorporated by reference herein.

BACKGROUND OF THE INVENTION

1. Field of the Invention

The present invention relates to a switching device handling large current, and a solar power generation system and a vehicle driving system using the same.

2. Description of the Related Art

In recent years, storage battery systems and EV (Electric Vehicle) are widely available, and the needs for switches handling large current is increasing. In this case, the EV includes electric vehicles, hybrid cars, plug-in hybrid cars, electric bicycles, and electric bikes.

SUMMARY OF THE INVENTION

It is required to reduce the loss of electric power in a switch handling large current and to reduce the cost of the switch.

A switching device according to an aspect of the present invention includes multiple series switch circuits in which a first switch receiving electric current and a second switch outputting the electric current are connected in series. A series-parallel switch circuit is constituted by connecting the series switch circuits in parallel, and middle points of the series switch circuits are joined, and when the series-parallel switch circuit is turned on, the second switches constituting the series-parallel switch circuit are turned on, and thereafter, the first switches constituting the series-parallel switch circuit are turned on.

BRIEF DESCRIPTION OF THE DRAWINGS

FIGS. 3A to 3D is figures for explaining a switch-ON sequence of a series-parallel switch circuit of FIG. 2;

FIGS. 4A to 4D are figures for explaining a switch-OFF sequence of a series-parallel switch circuit of FIG. 2;

DETAILED DESCRIPTION OF THE INVENTION

Figure 1A:
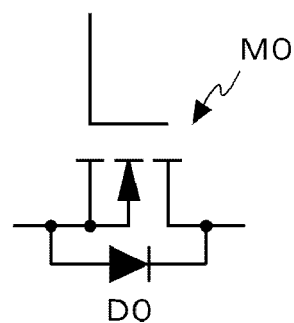
FIGS. 1A and 1B are figures for explaining a power MOSFET.

The invention will now be described by reference to the preferred embodiments. This does not intend to limit the scope of the present invention, but to exemplify the invention.

Switches widely used today include a MOSFET (Metal-Oxide-Semiconductor Field-Effect Transistor). A MOSFET capable of handling large current has a high ON-resistance, and accordingly, a method for reducing the ON-resistance by connecting MOSFETs in parallel is used.

When a large current is switched using MOSFETs connected in parallel, it is desired to turn on the MOSFETs connected in parallel substantially at the same time so as to avoid electric power from being concentrated on any one of the MOSFETs. However, to do this, a driver for driving the MOSFETs needs to achieve a high degree of accuracy, which results in a larger circuit and a higher cost. When the driver for driving the MOSFETs does not achieve a high degree of accuracy, in order to allow operation without break down caused by concentrated electric current even if any one of the MOSFETs is turned on first, there is no choice but to use MOSFETs having a higher maximum rated electric current, which leads to a higher cost.

In view of such circumstances, the inventor of the present invention has developed a technique for reducing the cost while suppressing the increase of the loss of the electric power of a switching device for large current. A switching device according to an embodiment of the present invention that has been developed is as follows.

(1) A switching device comprising a plurality of series switch circuits in which a first switch receiving electric current and a second switch outputting the electric current are connected in series, wherein a series-parallel switch circuit is constituted by connecting the series switch circuits in parallel, middle points of the series switch circuits are joined, and when the series-parallel switch circuit is turned on, the second switches constituting the series-parallel switch circuit are turned on, and thereafter, the first switches constituting the series-parallel switch circuit are turned on.

According to this aspect, by joining the middle points of the series switch circuits, the ON-resistance of the entire series-parallel switch circuit is reduced, and the loss of the electric power can be reduced. Since the maximum rated electric current of each switch can be reduced, a low-cost switch can be used. When the series-parallel switch circuit is turned on, the multiple second switches constituting the series-parallel switch circuit are turned on, and thereafter, the multiple first switches constituting the series-parallel switch circuit are turned on, so that this makes it possible to disregard variation in the switching speed of the multiple second switches. Therefore, the second switches and the driver of low-specs may be used, and the cost can be reduced.

(2) A switching device comprising a plurality of series switch circuits in which a first switch receiving electric current and a second switch outputting the electric current are connected in series, wherein a series-parallel switch circuit is constituted by connecting the series switch circuits in parallel, middle points of the series switch circuits are joined, and when the series-parallel switch circuit is turned on, the first switches constituting the series-parallel switch circuit are turned off, and thereafter, the second switches constituting the series-parallel switch circuit are turned off.

According to this aspect, by joining the middle points of the series switch circuits, the ON-resistance of the entire series-parallel switch circuit is reduced, and the loss of the electric power can be reduced. Since the maximum rated electric current of each switch can be reduced, a low-cost switch can be used. When the series-parallel switch circuit is turned off, the multiple first switches constituting the series-parallel switch circuit are turned off, and thereafter, the multiple second switches constituting the series-parallel switch circuit are turned off, so that this makes it possible to disregard variation in the switching speed of the multiple first switches. Therefore, the first switches and the driver of low-specs may be used, and the cost can be reduced.

(3) The switching device as described in (1), wherein when the series-parallel switch circuit is turned off, the multiple first switches constituting the series-parallel switch circuit are turned off, and thereafter, the multiple second switches constituting the series-parallel switch circuit are turned off.

According to this aspect, this makes it possible to disregard variation in the switching speed of the multiple first switches. Therefore, the first switches and the driver of low-specs may be used, and the cost can be reduced.

(4) The switching device as described in (3) further comprising a control unit for controlling ON/OFF of the first switches and the second switches, wherein a maximum rated electric current of at least one of the first switches is set at a level higher than a maximum rated electric current of the remaining first switches and the second switches, when the series-parallel switch circuit is turned on, the control unit turns on the second switches, thereafter turns on a first switch of which maximum rated electric current is high, and thereafter, turns on the remaining first switches, and when the series-parallel switch circuit is turned off, the control unit turns off the remaining first switches, thereafter turns off a first switch of which maximum rated electric current is high, and thereafter, turns off the second switches.

According to this aspect, when the series-parallel switch circuit is turned on, the multiple second switches are turned on, and thereafter, the first switch of which maximum rated electric current is high is turned on, and thereafter, the remaining first switches are turned on. When the series-parallel switch circuit is turned off, the remaining first switches are turned off, thereafter, the first switch of which maximum rated electric current is high is turned off, and thereafter, the multiple second switches are turned off. Since the first switch of which maximum rated electric current is high can pass a large current, the remaining first switches of low-specs may be used, and the cost can be reduced. Since it is not necessary to turn on the first switches at the same time, the driver of low-specs may be used therefor, and the cost can be reduced.

(5) The switching device as described in (4), wherein the first switch of which maximum rated electric current is high is constituted by a transistor having a trench structure, and the remaining first switches and the second switches are constituted by a transistor having a planar structure, and the series-parallel switch circuit is made into a module in an integrated manner.

According to this aspect, the first switch of which the maximum rated electric current is high is constituted with the transistor having the trench structure, and therefore, switching can be achieved with a high degree of accuracy. Since the remaining first switches and the multiple second switches are constituted with the transistors having the planar structure, the cost can be reduced.

(6) The switching device as described in (1) to (5), wherein the first switches and the second switches are constituted by MOSFETs (Metal-Oxide-Semiconductor Field-Effect Transistor), and the first switch and the second switch are connected in series such that directions of body diodes formed in the MOSFETs are different from each other.

According to this aspect, the electric current passing through a parasitic diode can be cut off, and the series switch circuit including the first switch and the second switch can be used as a bidirectional switch.

(7) A switching device comprising a plurality of series switch circuits in which a first switch receiving electric current and a second switch outputting the electric current are connected in series, wherein a series-parallel switch circuit is constituted by connecting the series switch circuits in parallel, middle points of the series switch circuits are joined, and when the series-parallel switch circuit is turned on, the second switches constituting the series-parallel switch circuit are turned on, thereafter, the first switches constituting the series-parallel switch circuit are turned on, and thereafter, at least one of the first switches is turned on, whereby electric current non-conducting state is cancelled.

According to this aspect, by joining the middle points of the series switch circuits, the ON-resistance of the entire series-parallel switch circuit is reduced, and the loss of the electric power can be reduced. Since the maximum rated electric current of each switch can be reduced, a low-cost switch can be used. When the series-parallel switch circuit is turned on, the multiple second switches constituting the series-parallel switch circuit are turned on, and thereafter, the multiple first switches constituting the series-parallel switch circuit are turned on, and at least one of the first switches is turned on, whereby the electric current non-conducting state is cancelled. Therefore, this makes it possible to disregard variation in the switching speed of the multiple second switches. Therefore, the second switches and the driver of low-specs may be used, and the cost can be reduced. Moreover, this makes it possible to disregard variation in the switching speed of the multiple first switches. Therefore, the first switches and the driver of low-specs may be used, and the cost can be reduced.

(8) A solar power generation system comprising: a storage battery; a solar power generation module; a DC-DC converter for performing DC-DC conversion of an output electric power of the solar power generation module and a discharge electric power of the storage battery; a power conditioner for performing DC-AC conversion of an output electric power of the DC-DC converter; and the switching device as described in any of (1) to (7) connected between the storage battery and the DC-DC converter.

According to this aspect, it is possible to reduce the cost while suppressing the increase of the loss of the electric power of the switching devices used for the solar power generation system.

(9) A vehicle driving system comprising: a storage battery; a AC-DC converter for performing AC-DC conversion of an alternating current electric power from a commercial system; a DC-DC converter for performing DC-DC conversion of a discharge electric power of the storage battery and an output electric power of the AC-DC converter; an inverter for receiving an output electric power of the DC-DC converter and driving a motor; and the switching device as described in any of (1) to (7) connected between the storage battery and the DC-DC converter.

According to this aspect, it is possible to reduce the cost while suppressing the increase of the loss of the electric power of the switching devices used for the vehicle driving system.

Before explaining the entire configuration of a switching device according to an embodiment of the present invention, each switch constituting the switching device will be explained. In the explanation below, for example, a power MOSFET is used as the switch in the present embodiment.

Figure 1B:
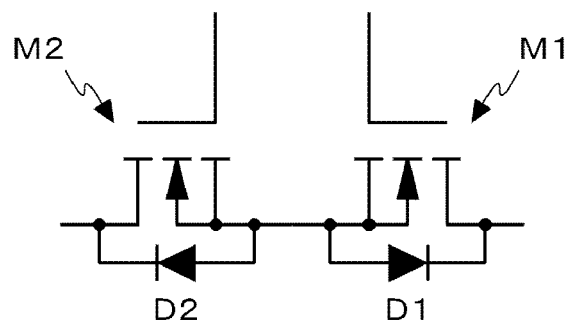

FIGS. 1A and 1B are figures for explaining a power MOSFET. FIG. 1A is a figure for explaining the power MOSFET by itself. In the power MOSFET, a parasitic diode is formed between the source and the drain. Hereinafter, in this specification, this parasitic diode is denoted as body diode D0 as necessary.

In the explanation below, the following case will be considered: the power MOSFET is used as a switch M0. First, the following case will be considered: electric current between a battery and a load is used as a switch for switching. In this case, the battery is connected to the drain terminal, and the source terminal is connected to the load. The gate terminal is a terminal for controlling ON/OFF of the switch M0. When the load is shorted in this connection form, useless electric current is passed from the battery to the load through the body diode D0 even in the OFF state of the switch M0.

Subsequently, the following case will be considered: the storage battery is connected to the drain terminal, and a solar power generation module is connected to the source terminal. Even in this case, when the solar power generation module is shorted, useless electric current flows from the storage battery to the solar power generation module.

When an operator connects the battery and the load oppositely by mistake, the electric current flows to the load connected to the drain terminal through the body diode D0 from the battery connected to the source terminal even in the OFF state of the switch M0, and the function as the switch M0 cannot be achieved.

FIG. 1B is a figure for explaining a circuit made by connecting two power MOSFETs in series. In FIG. 1B, the source terminals of the two power MOSFETs are connected with each other. In this case, the anodes of the parasitic diodes of the two power MOSFETs face each other, and the problem listed in the explanation of FIG. 1A can be avoided. When a series circuit is made by connecting the source terminals of the two power MOSFETs in series, the series circuit functions as a bidirectional switch. Hereinafter, the series circuit will be referred to as a series switch circuit. In this specification, a switch at the right side of the series switch circuit drawn in the drawing is defined as a first switch M1, and a switch at the left side is defined as a second switch M2.

In the series switch circuit of FIG. 1B, regardless of whether electric current is provided from the drain terminal of the first switch M1 or electric current is provided from the drain terminal of the second switch M2, the first body diode D1 and the second body diode D2 are in the opposite directions from each other, and therefore, the electric current by way of the parasitic diode is cut off. Therefore, the series switch circuit can be used as a bidirectional switch. It should be noted that the series switch circuit may be made by connecting the drain terminals of the two power MOSFETs in series. Even in this case, the electric current by way of the parasitic diode is cut off, and it can be used as the bidirectional switch.

In FIG. 1B, when the gate of the second switch M2 is turned on, electric current can be passed from the drain terminal of the second switch M2 to the drain terminal of the first switch M1 even when the gate of the first switch M1 is not turned on. However, the electric current passes through the first body diode D1, and therefore, the electric power is lost for the amount of decrease of the voltage at the first body diode D1. The upper limit of the usable range of the battery voltage decreases for the amount of decrease of the voltage at the first body diode D1, and therefore, the battery cannot be used at the maximum voltage. Therefore, when electric current is passed from the drain terminal of the second switch M2 to the drain terminal of the first switch M1, it is preferable to turn on the gates of both of the second switch M2 and the first switch M1. The same argument is applicable even when electric current is passed from the drain terminal of the first switch M1 to the drain terminal of the second switch M2.

Figure 2:
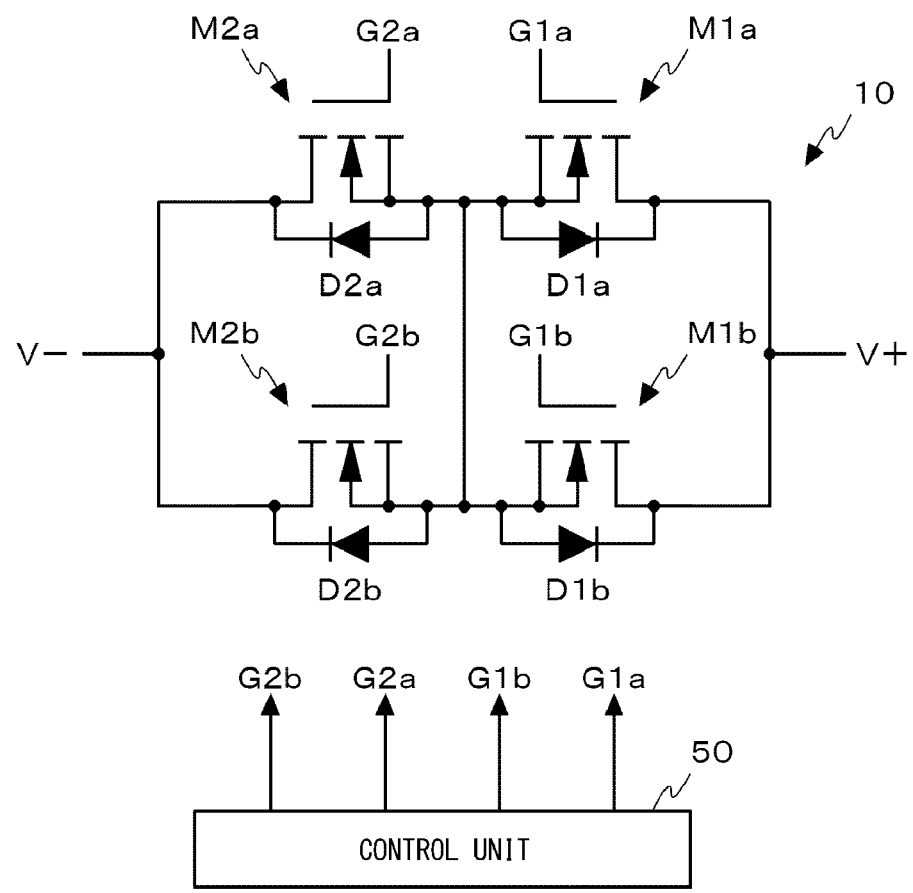
FIG. 2 is a figure illustrating a configuration of a switching device according to an embodiment of the present invention.

FIG. 2 is a figure illustrating a configuration of a switching device 100 according to an embodiment of the present invention. The switching device 100 includes a series-parallel switch circuit 10 and a control unit 50. The series-parallel switch circuit 10 includes multiple series switch circuits explained above (two series switch circuits in FIG. 2). The multiple series switch circuits are connected in parallel, and the middle points of the multiple series switch circuits are joined. In the present embodiment, the drain terminals of the first switch M1a and the first switch M1b are joined to make an electric current input terminal, and the drain terminals of the second switch M2a and the second switch M2b are joined to make an electric current output terminal.

Hereinafter, basic operation of the series-parallel switch circuit 10 will be explained. When the series-parallel switch circuit 10 is turned on, the second switches M2 (the second switch M2a and the second switch M2b in FIG. 2) connected to the electric current output terminal are turned on, and thereafter, the multiple first switches M1 connected to the electric current input terminal (the first switch M1a and the first switch M1b in FIG. 2) are turned on.

On the other hand, when the series-parallel switch circuit 10 is turned off, the multiple first switches M1 (the first switch M1a and the first switch M1b in FIG. 2) connected to the electric current input terminal are turned off, and thereafter, the multiple second switches M2 (the second switch M2a and the second switch M2b in FIG. 2) connected to the electric current output terminal are turned off.

The maximum rated electric current of at least one of the multiple first switches M1 is set higher than the maximum rated electric current of the remaining first switches M1 and the multiple second switches M2. In FIG. 2, a high-spec switch of which maximum rated electric current (i.e., electric current allowable amount) is the highest is employed as the first switch M1a. Low-cost switches are employed for the first switch M1b, the second switch M2a, and the second switch M2b. Therefore, the first switch M1b, the second switch M2a, and the second switch M2b are of lower-spec than the first switch M1a.

In this case, instead of MOSFET for the high-spec first switch M1a, a switch having rectifying characteristics such as a body diode-attached IGBT (Insulated Gate Bipolar Transistor), a body diode-attached GaN transistor, and a body diode-attached SiC transistor may be used. Within the scope not beyond the gist of cost reduction, the switch having the rectifying characteristics may be used instead of MOSFET for the first switch M1b, the second switch M2a and the second switch M2b.

The control unit 50 controls ON/OFF state of the multiple first switches M1 and the multiple second switches M2. In FIG. 2, the control unit 50 controls ON/OFF state of the gate G1a of the first switch M1a, the gate G1b of the first switch M1b, the gate G2a of the second switch M2a, and the gate G2b of the second switch M2b. In FIG. 2, the detailed circuit configuration of the gate driver is not shown, but is considered to be a part of functional blocks of the control unit 50, and the following explanation will be continued.

FIGS. 3A to 3D are figures for explaining a switch-ON sequence of the series-parallel switch circuit 10 of FIG. 2. FIG. 3A is a figure for explaining a first status (initial status) of the switch-ON sequence of the series-parallel switch circuit 10. In the first status, the series-parallel switch circuit 10 is in the OFF state, and therefore, all of the first switch M1a, the first switch M1b, the second switch M2a, and the second switch M2b are in the OFF state.

FIG. 3B is a figure for explaining a second status of the switch-ON sequence of the series-parallel switch circuit 10. The control unit 50 turns on the second switch M2a and the second switch M2b. As a result, in the second status, the second switch M2a and the second switch M2b are in the ON state, and the first switch M1a and the first switch M1b are in the OFF state.

It should be noted that the control unit 50 need not turn on the second switch M2a and the second switch M2b at the same time. It may be possible to make a choice so that the cost of the gate driver is lower, depending on the case where they are turned on at the same time or the case where they are turned on with a time difference. In the second status, since the first switch M1a and the first switch M1b are in the OFF state, the entire series-parallel switch circuit 10 is in the OFF state, and the series-parallel switch circuit 10 still cuts off the electric current.

FIG. 3C is a figure for explaining a third status of the switch-ON sequence of the series-parallel switch circuit 10. The control unit 50 turns on the first switch M1a of which maximum rated electric current is the highest in the series-parallel switch circuit 10. As a result, in the third status, the first switch M1a, the second switch M2a, and the second switch M2b are in the ON state, and the first switch M1b is in the OFF state.

In the third status, according to the Kirchhoff's Current Law, the electric current flowing to the first switch M1a is a summation of the electric current flowing to the second switch M2a and the electric current flowing to the second switch M2b. As illustrated in FIG. 2, the middle points of the series switch circuits are joined, and therefore, even when the maximum rated electric current of the second switch M2a is low, a relatively large current can be passed to the first switch M1a.

FIG. 3D is a figure for explaining a fourth status (final status) of the switch-ON sequence of the series-parallel switch circuit 10. The control unit 50 turns on the first switch M1b connected in parallel to the first switch M1a of which maximum rated electric current is the highest in the series-parallel switch circuit 10. As a result, all the first switch M1a, the first switch M1b, the second switch M2a, and the second switch M2b are in the ON state. As compared with the second status, the fourth status is such that the electric current also flows to the first switch M1b connected in parallel to the first switch M1a, and accordingly, the ON-resistance of the entire series-parallel switch circuit 10 is reduced.

FIGS. 4A to 4D are figures for explaining a switch-OFF sequence of the series-parallel switch circuit 10 of FIG. 2. FIG. 4A is a figure for explaining a first status (initial status) of the switch-OFF sequence of the series-parallel switch circuit 10. In the first status, the series-parallel switch circuit 10 is in the ON state, and therefore, all of the first switch M1a, the first switch M1b, the second switch M2a, and the second switch M2b are in the ON state.

FIG. 4B is a figure for explaining a second status of the switch-OFF sequence of the series-parallel switch circuit 10. The control unit 50 turns off the first switch M1b connected in parallel to the first switch M1a of which maximum rated electric current is the highest in the series-parallel switch circuit 10. As a result, in the second status, the first switch M1a, the second switch M2a, and the second switch M2b are in the ON state, and the first switch M1b is in the OFF state. In the second status, according to the Kirchhoff's Current Law, the electric current flowing to the first switch M1a is a summation of the electric current flowing to the second switch M2a and the electric current flowing to the second switch M2b. As described above, even when the maximum rated electric current of the second switch M2a is low, a relatively large current can be passed to the first switch M1a, but the ON-resistance of the entire series-parallel switch circuit 10 increases.

FIG. 4C is a figure for explaining a third status of the switch-OFF sequence of the series-parallel switch circuit 10. The control unit 50 turns on the first switch M1a of which maximum rated electric current is the highest in the series-parallel switch circuit 10. As a result, in the third status, the second switch M2a and the second switch M2b are in the ON state, and the first switch M1a and the first switch M1b are in the OFF state. In the third status, since the first switch M1a and the first switch M1b are in the OFF state, the entire series-parallel switch circuit 10 is in the OFF state, and the series-parallel switch circuit 10 cuts off the electric current.

FIG. 4D is a figure for explaining a fourth status (final status) of the switch-OFF sequence of the series-parallel switch circuit 10. The control unit 50 turns on the second switch M2a and the second switch M2b. As a result, all the first switch M1a, the first switch M1b, the second switch M2a, and the second switch M2b are in the OFF state.

Figure 5:
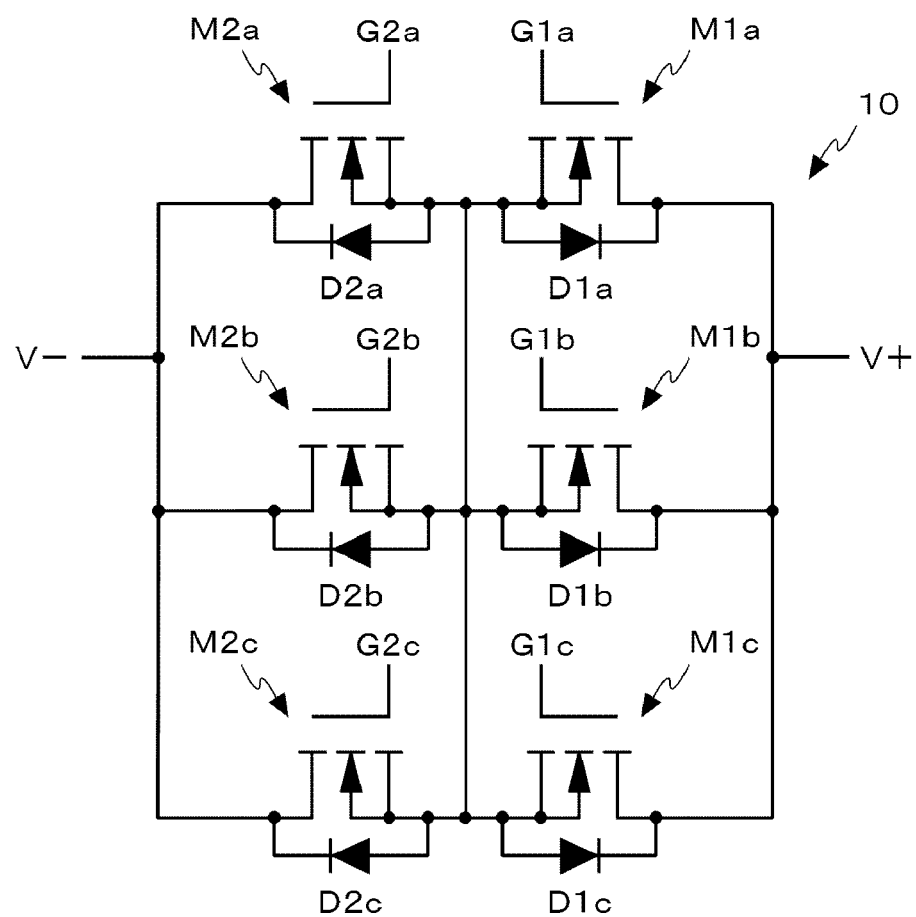
FIG. 5 is a figure for explaining a first modification of the series-parallel switch circuit of FIG. 2.
Figure 6:
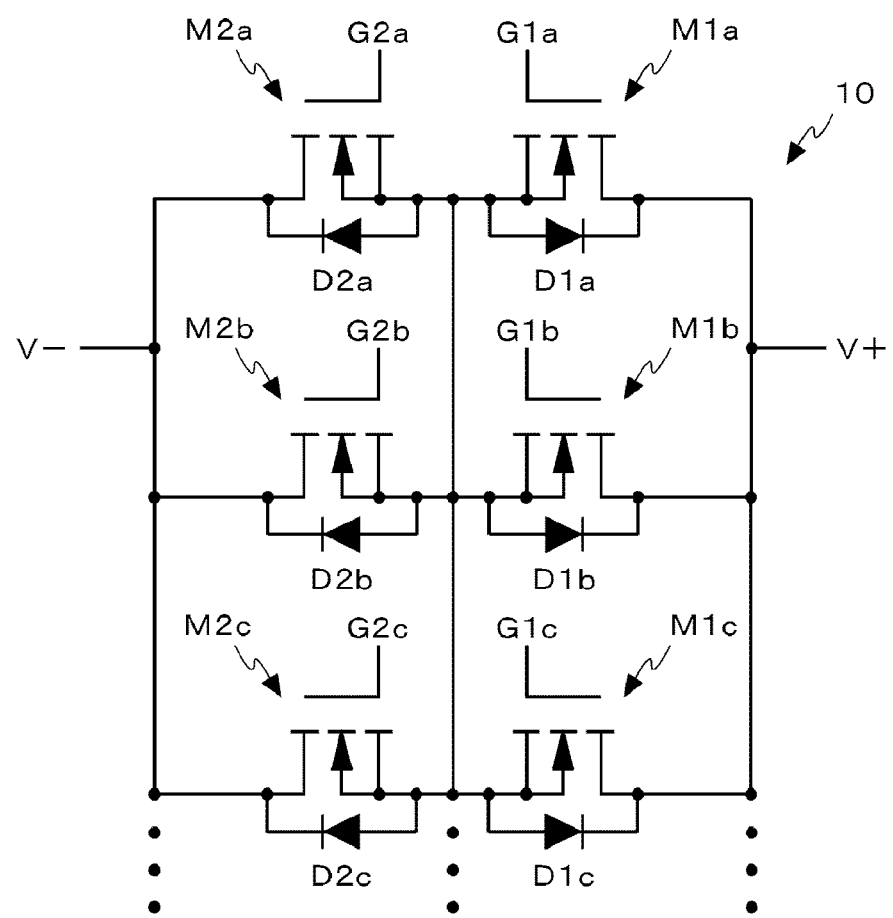
FIG. 6 is a figure for explaining a second modification of the series-parallel switch circuit of FIG. 2.

FIG. 5 is a figure for explaining a first modification of the series-parallel switch circuit 10 of FIG. 2. FIG. 6 is a figure for explaining a second modification of the series-parallel switch circuit 10 of FIG. 2. In the series-parallel switch circuit 10 of FIG. 2, two series switch circuits are connected in parallel, but the number of series switch circuits connected in parallel is not limited to two. In the first modification of FIG. 5, three series switch circuits are connected in parallel. In the second modification of FIG. 6, n (n is equal to or more than 4) series switch circuits are connected in parallel. In any of the series-parallel switch circuits 10, the middle points of the multiple series switch circuits connected in parallel are joined.

In the explanation about the series-parallel switch circuit 10 of FIG. 2, for example, one high-spec switch of the multiple first switches M1 is provided, but multiple high-spec switches may be provided in the first and second modifications.

Hereinafter, the ON-resistance of the entire series-parallel switch circuit 10 will be explained. The ON-resistance Ront2 of the entire series-parallel switch circuit 10 of FIG. 2 is calculated according to Expression 1 below. The ON-resistances of all the switches are considered to be the same.

$$Ront2=1/((1/M1aRon+1/M2abRon)+(1/M1bRon+1/M2bRon)) \quad \text{(Expression 1)}$$

In this case, M1aRon denotes the ON-resistance of the first switch M1a. The other switches are also denoted likewise.

The ON-resistance Ront3 of the entire series-parallel switch circuit 10 of FIG. 5 is calculated according to Expression 2 below.

$$\text{Ront3}=1/((1/M1a\text{Ron}+1/M2a\text{Ron})+(1/M1b\text{Ron}+1/M2b\text{Ron})+(1/M1c\text{Ron}+1/M2c\text{Ron})) \quad \text{(Expression 2)}$$

The relational expression of the ON-resistance Ront2 of the entire series-parallel switch circuit 10 including two circuits in parallel in FIG. 2 and the ON-resistance Ront3 of the entire series-parallel switch circuit 10 including three circuits in parallel in FIG. 5 is shown in Expression 3 below.

$$\text{Ront3}=2/3\cdot\text{Ront2} \quad \text{(Expression 3)}$$

The relational expression of the ON-resistance Ront2 of the entire series-parallel switch circuit 10 including two circuits in parallel and the ON-resistance Ront4 of the entire series-parallel switch circuit including four circuits in parallel is shown in Expression 4 below.

$$\text{Ront4}=1/2\cdot\text{Ront2} \quad \text{(Expression 4)}$$

The general expression indicating the relationship of the ON-resistance Ront2 of the entire series-parallel switch circuit 10 including two circuits in parallel and the ON-resistance Rontn of the entire series-parallel switch circuit 10 including n (n is an integer equal to or more than two) circuits in parallel is Expression 5 below.

$$\text{Ront}n=2/n\cdot\text{Ront2} \quad \text{(Expression 5)}$$

As described above, as the number of circuits in parallel increases, the ON-resistance of the entire series-parallel switch circuit 10 decreases, but the size of the circuit increases, and both of them in the trade-off relationship. However, as the number of circuits in parallel increases, the maximum rated electric current of each switch can be reduced, and therefore, low-cost switches can be used. Therefore, the entire cost is determined by the balance of the increase of the cost due to the increase of the number of switches and the decrease of the cost due to each of the low-spec switches.

Figure 7:
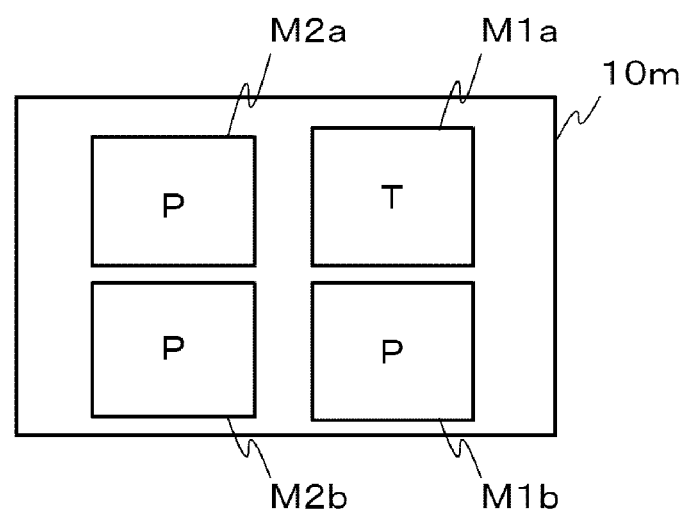
FIG. 7 is a figure for schematically explaining a series-parallel switch circuit of two circuits in parallel made into a module.

The series-parallel switch circuit 10 according to the present embodiment is formed and by being integrally made into a module. FIG. 7 is a figure for schematically explaining the series-parallel switch circuit 10 of two circuits in parallel made into a module. A switching module 10m of FIG. 7 shows an example obtained by making the series-parallel switch circuit 10 of FIG. 2 into a module. In the switching module 10m of FIG. 7, the first switch M1a of which maximum rated electric current is required to be high is constituted by a transistor having trench structure capable of achieving high-spec (for example, trench gate-type power MOSFET), and the first switch M1b, the second switch M2a, and the second switch M2b are constituted by a transistor having planar structure that can be achieved with a relatively low cost (for example, planar gate-type power MOSFET).

Figure 8A:
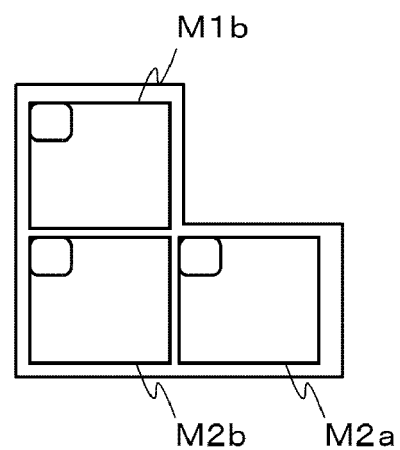
FIGS. 8A and 8B are figures for explaining an example for forming a first switch M1b, a second switch M2a, and a second switch M2b of FIG. 7 using the same process.
Figure 8B:
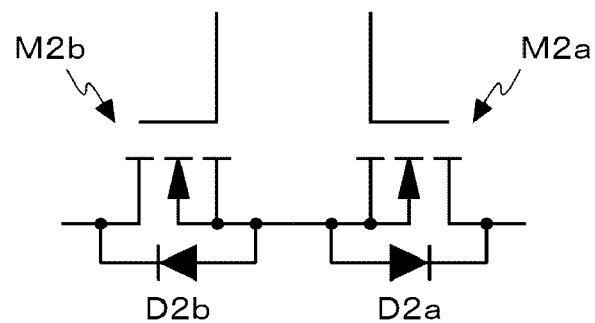

FIGS. 8A and 8B are figures for explaining an example for forming the first switch M1b, the second switch M2a and the second switch M2b of FIG. 7 using the same process. In FIG. 8, for example, the first switch M1b, the second switch M2a, and the second switch M2b of FIG. 7 are considered to use the planar gate-type power MOSFETs.

FIG. 8A depicts the following example: when multiple planar gate-type power MOSFETs formed on a wafer is diced, a region including three planar gate-type power MOSFETs is diced as a single chip in accordance with an arrangement shape of the first switch M1b, the second switch M2a, and the second switch M2b of the switching module 10m of FIG. 7. It should be noted that the number of planar gate-type power MOSFETs diced as a single chip is not limited to three. For example, in the series-parallel switch circuit 10 having three circuits in parallel of FIG. 5, a region including five planar gate-type power MOSFETs may be diced as a single chip. FIG. 8A shows an example where a region is diced in an L shape in order to dice it in accordance with the arrangement shape of the switches of the same spec, and in general, it is basic to dice it in a straight shape. For example, in FIG. 7, it may be possible to dice it in a straight manner between the group of the first switch M1a and the first switch M1b and the group of the second switch M2a and the second switch M2b. The second switch M2a, the second switch M2b, and the first switch M1b may be arranged in one row, and three switches in the row may be diced as a single chip.

FIG. 8B illustrates a series switch circuit made of the second switch M2a and the second switch M2b diced as a single chip. Unlike the type in which the sources are connected with each other in FIG. 1B, the series switch circuit is a type in which the drains are connected with each other, but it is basically the same as the series-parallel switch circuit 10 explained above.

According to the present embodiment as explained above, the multiple series switch circuits are connected in parallel, and the middle points of the multiple series switch circuits are joined, so that the cost of each switch and driver can be reduced while the increase of the loss of electric power is suppressed. More specifically, the series switch circuits are made into parallel, so that the ON-resistance of the entire series-parallel switch circuit is reduced, and accordingly, the loss of electric power can be reduced.

Even when there is variation in the switching speeds of the switches constituting the series-parallel switch circuit, the chance of concentration of electric current to one switch can be reduced. More specifically, when the series-parallel switch circuit is turned on, the switches at an electric current supply destination-side are turned on first, and then the switches at an electric current supply source-side are turned on subsequently, so that variation in the switching speed of the switches at the electric current supply destination-side may be disregarded. Therefore, the switches at the electric current supply destination-side and the driver thereof may be of low-specs, and the cost can be reduced.

At least one of the switches at the electric current supply source-side is a switch of high-spec, and this switch is turned on earlier than the remaining switches. Since the high-spec switch can pass a large current, the remaining switches of low-specs may be used, and the cost can be reduced. Since it is not necessary to turn on the switches at the same time, the driver of low-specs may be used therefor, and the cost can be reduced.

Figure 9:
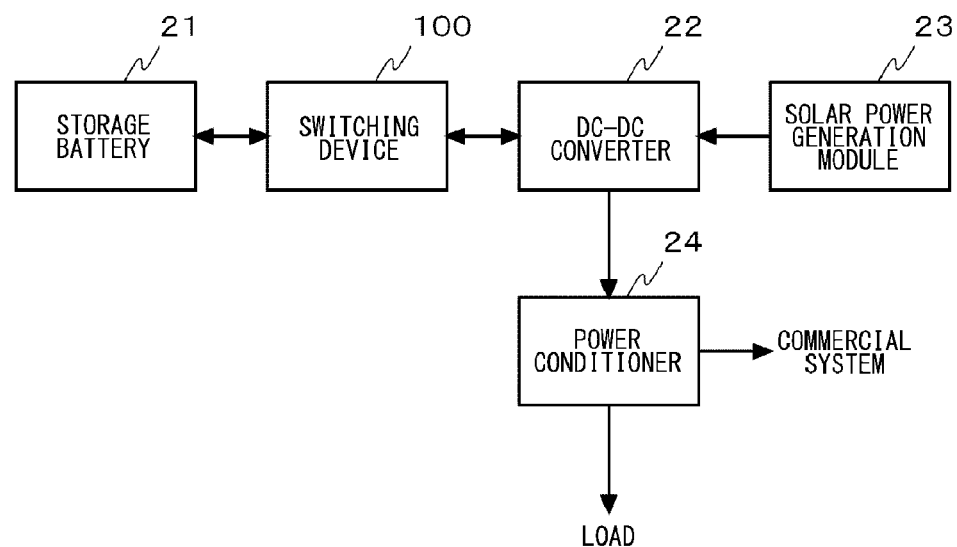
FIG. 9 is a figure for explaining a configuration of a solar power generation system to which the switching device according to the embodiment of the present invention is applied.

Subsequently, an example of application of the switching device 100 according to the embodiment of the present invention will be explained. FIG. 9 is a figure for explaining a configuration of a solar power generation system 200 to which the switching device 100 according to the embodiment of the present invention is applied. In FIG. 9, the solar power generation system 200 for household use will be considered. The solar power generation system 200 includes a storage battery 21, a switching device 100, a DC-DC converter 22, a solar power generation module 23, and a power conditioner 24.

The storage battery 21 mainly stores electric power generated by the solar power generation module 23. A lead-acid battery, a lithium-ion battery, and the like can be used as the storage battery 21. The solar power generation module 23 converts solar light energy into electric energy and outputs the energy to the DC-DC converter 22. The switching device 100 is connected between the storage battery 21 and the DC-DC converter 22.

The DC-DC converter 22 performs DC-DC conversion of the output electric power of the solar power generation module 23 or DC-DC conversion of the discharge electric power of the storage battery 21. More specifically, the DC-DC converter 22 converts the output electric power of the solar power generation module 23 into electric power according to rated electric power of the supply destination (the storage battery 21 or the power conditioner 24). The DC-DC converter 22 converts the discharge electric power of the storage battery 21 into electric power according to the rated electric power of the power conditioner 24.

The power conditioner 24 performs DC-AC conversion of the output electric power of the DC-DC converter 22. The alternating current electric power which is output from the power conditioner 24 is supplied to a load (household electrical appliances and the like), or supplied to a commercial system (electric power company and the like). When the power conditioner 24 has a bidirectional DC-AC converter, the alternating current electric power supplied from the commercial system can be converted into direct current electric power, and can be stored in the storage battery 21.

Figure 10:
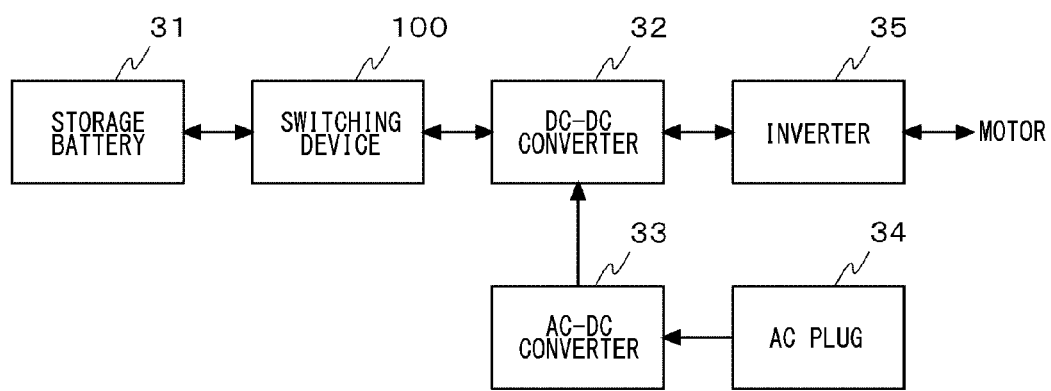
FIG. 10 is a figure for explaining a configuration of a vehicle driving system to which the switching device according to the embodiment of the present invention is applied.

FIG. 10 is a figure for explaining a configuration of a vehicle driving system 300 to which the switching device 100 according to the embodiment of the present invention is applied. The vehicle driving system 300 is a driving system of a vehicle (for example, automobile, motorcycle, bicycle) that runs using electric energy as main energy or auxiliary energy. The vehicle driving system 300 includes a storage battery 31, a switching device 100, a DC-DC converter 32, an AC-DC converter 33, an AC plug 34, and an inverter 35.

The storage battery 31 mainly stores electric power supplied from the commercial system. When regeneration brake function is provided, regenerated electric power is also stored. The AC plug 34 is a plug for obtaining alternating current electric power from the commercial system. The AC-DC converter 33 performs AC-DC conversion of the alternating current electric power obtained from the AC plug 34.

The DC-DC converter 32 performs DC-DC conversion of the output electric power of the AC-DC converter 33 and the discharge electric power of the storage battery 31. More specifically, the DC-DC converter 32 converts the output electric power of the AC-DC converter 33 into electric power according to the rated electric power of the storage battery 31. The DC-DC converter 32 converts the discharge electric power of the storage battery 31 into electric power according to the rated electric power of the AC plug 34. When the regenerated electric power is supplied from the inverter 35, the DC-DC converter 32 converts the regenerated electric power into electric power according to the rated electric power of the storage battery 31.

The switching device 100 is connected between the storage battery 31 and the DC-DC converter 32. The inverter 35 drives a motor according to the driving electric power from the DC-DC converter 32. When the regeneration brake is activated, the regenerated electric power is collected from the motor, and is supplied to the DC-DC converter 32.

The present invention has been explained with reference to the embodiment. The embodiment is merely an example, and a person skilled in the art would understand that various modifications can be made in a combination of the constituent elements and processing process, and these modifications are also within the scope of the present invention.

For example, in the above explanation, in the series-parallel switch circuit 10, the drain terminal of the first switch M1 is the electric current input terminal, the drain terminal of the second switch M2 is the electric current output terminal, and electric current flows from the side of the first switch M1 to the side of the second switch M2. With regard to this point, the series-parallel switch circuit 10 can also be used as a bidirectional series-parallel switch circuit. In this case, the drain terminal of the first switch M1 acts as not only the electric current input terminal but also the electric current output terminal, and the drain terminal of the second switch M2 also acts as not only the electric current input terminal but also the electric current output terminal. At least one of the multiple second switches M2 is preferably a high-spec switch. The above explanation can also be applied to backward electric current without any change.

For example, semiconductor switches are used as switches constituting the series-parallel switch circuit 10 explained above, but a mechanical relay may also be used as at least one of the switches, without deviating from the gist of cost reduction.

In the solar power generation system 200 as illustrated in FIG. 9 explained above, the power conditioner 24 may be provided between the DC-DC converter 22 and the solar power generation module 23. A solar power generation module 23 may be added to the vehicle driving system 300 as illustrated in FIG. 10 explained above. In this case, the solar power generation module 23 is connected to the DC-DC converter 32.

What is claimed is:
1. A switching apparatus comprising:
an input terminal configured to receive current;
an output terminal configured to output the current;
a first switch including a first-first terminal, and a first-second terminal which is connected with the input terminal;
a second switch including a second-first terminal which is connected with the first-first terminal of the first switch, and a second-second terminal which is connected with the output terminal;
a third switch including a third-first terminal which is connected with the first-first terminal of the first switch, and a third-second terminal which is connected with the input terminal;
a fourth switch including a fourth-first terminal which is connected with the third-first terminal of the third switch, and a fourth-second terminal which is connected with the output terminal; and
a controller configured to turn on and off the first to fourth switches, wherein
the first switch has a higher maximum current rating than the second switch, the third switch, and the fourth switch,
the controller turns off the first to fourth switches,
in a state that the first to fourth switches are in an off state, the controller turns on the second switch and the fourth switch,
in a state that the second switch and the fourth switch are in an on state and the first and third switch are in an off state, the controller turns on the first switch, and
in a state that the first switch, the second switch and the fourth switch are in an on state and the third switch is in an off state, the controller turns on the third switch.
2. The switching apparatus according to claim 1, wherein in a state that the first to fourth switches are in an on state, the controller turns off the third switch, in a state that the first switch, the second switch and the fourth switch are in an on state and the third switch is in an off state, the controller turns off the first switch, in a state that the second switch and the fourth switch are in an on state and the first and third switch are in an off state, the controller turns off the second switch and the fourth switch.

3. The switching apparatus according to claim 1, wherein the first switch is a transistor having a trench gate structure, and the second switch, the third switch, and the fourth switch each are a transistor having a planar gate structure.

4. The switching apparatus according to claim 1, wherein the first switch is a first Metal-Oxide-Semiconductor Field-Effect Transistor having a first body diode, the second switch is a second Metal-Oxide-Semiconductor Field-Effect Transistor having a second body diode, the third switch is a third Metal-Oxide-Semiconductor Field-Effect Transistor having a third body diode, the fourth switch is a fourth Metal-Oxide-Semiconductor Field-Effect Transistor having a fourth body diode, the first body diode and the second body diode are reversely connected with each other, and the third body diode and the fourth body diode are reversely connected with each other.

5. The switching apparatus according to claim 1, wherein the controller includes a gate driver.

6. A solar power generation system comprising:
a storage battery configured to discharge a first DC power;
a solar power generation module configured to generate a second DC power;
a DC-DC converter configured to convert the first DC power or the second DC power into a third DC power;
a DC-AC converter configured to convert the third DC power into an AC power; and
the switching apparatus according to claim 1 connected between the storage battery and the DC-DC converter.

7. A vehicle driving system comprising:
a storage battery configured to discharge a first DC power;
an AC-DC converter configured to convert an AC power supplied from a commercial system to a second DC power;
a DC-DC converter configured to convert the first DC power or the second DC power into a third DC power;
an inverter configured to generate a driving power from the third DC power to drive a motor; and
the switching apparatus according to claim 1 connected between the storage battery and the DC-DC converter.

8. A switching apparatus comprising:
an input terminal configured to receive current;
an output terminal configured to output the current;
a first switch including a first-first terminal, and a first-second terminal which is connected with the input terminal;
a second switch including a second-first terminal which is connected with the first-first terminal of the first switch, and a second-second terminal which is connected with the output terminal;
a third switch including a third-first terminal which is connected with the first-first terminal of the first switch, and a third-second terminal which is connected with the input terminal;

a fourth switch including a fourth-first terminal which is connected with the third-first terminal of the third switch, and a fourth-second terminal which is connected with the output terminal; and a controller configured to turn on and off the first to fourth switches, wherein the first switch has a higher maximum current rating than the second switch, the third switch, and the fourth switch, the controller turns on the first to fourth switches, in a state that the first to fourth switches are in an on state, the controller turns off the third switch, in a state that the first switch, the second switch and the fourth switch are in an on state and the third switch is in an off state, the controller turns off the first switch, and in a state that the second switch and the fourth switch are in an on state and the first and third switch are in an off state, the controller turns off the second switch and the fourth switch.

9. The switching apparatus according to claim 8, wherein the first switch is a transistor having a trench gate structure, and the second switch, the third switch, and the fourth switch each are a transistor having a planar gate structure.

10. The switching apparatus according to claim 8, wherein
the first switch is a first Metal-Oxide-Semiconductor Field-Effect Transistor having a first body diode, the second switch is a second Metal-Oxide-Semiconductor Field-Effect Transistor having a second body diode, the third switch is a third Metal-Oxide-Semiconductor Field-Effect Transistor having a third body diode, the fourth switch s a fourth Metal-Oxide-Semiconductor Field-Effect Transistor having a fourth body diode, the first body diode and the second body diode are reversely connected with each other, and the third body diode and the fourth body diode are reversely connected with each other.

11. The switching apparatus according to claim 8, wherein the controller includes a gate driver.

12. A solar power generation system comprising:
a storage battery configured to discharge a first DC power;
a solar power generation module configured to generate a second DC power;
a DC-DC converter configured to convert the first DC power or the second DC power into a third DC power;
a power conditioner configured to convert the third DC power into an AC power; and
the switching apparatus according to claim 8 connected between the storage battery and the DC-DC converter.

13. A vehicle driving system comprising:
a storage battery configured to discharge a first DC power;
an AC-DC converter configured to convert an AC power supplied from a commercial system to a second DC power;
a DC-DC converter configured to convert the first DC power or the second DC power into a third DC power;
an inverter configured to generate a driving power from the third DC power to drive a motor; and
the switching apparatus according to claim 8 connected between the storage battery and the DC-DC converter.

* * * * *